United States Patent
Fuchigami et al.

(10) Patent No.: US 7,091,659 B2
(45) Date of Patent: Aug. 15, 2006

(54) ORGANIC ELECTRO LUMINESCENCE ELEMENT AND MANUFACTURING METHOD THEREOF

(75) Inventors: Hiroyuki Fuchigami, Hyogo (JP); Kazushi Yamayoshi, Hyogo (JP); Tomoyuki Irizumi, Hyogo (JP); Koji Oda, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 170 days.

(21) Appl. No.: 10/832,452

(22) Filed: Apr. 27, 2004

(65) Prior Publication Data

US 2004/0256984 A1 Dec. 23, 2004

(30) Foreign Application Priority Data

Apr. 28, 2003 (JP) .............................. 2003-124163

(51) Int. Cl.
*H05B 33/26* (2006.01)
(52) U.S. Cl. ................... 313/509; 313/505; 313/506
(58) Field of Classification Search ................ 313/505, 313/506, 509
See application file for complete search history.

(56) References Cited

U.S. PATENT DOCUMENTS 6,133,581 A * 10/2000 Terao et al. ................... 257/40
6,888,520 B1 * 5/2005 Ouchi et al. ................... 345/82

FOREIGN PATENT DOCUMENTS

| JP | P2001-43980 A | 2/2001 |
| JP | P2002-198182 A | 7/2002 |
| WO | WO 03/022011 A1 | 3/2003 |

OTHER PUBLICATIONS

Jiro Yamada, et al., "Micro Cavity Structures for Full Color AM-OLED Displays", Digest of Technical Papers, International Workshop on Active-Matrix Liquid-Crystal Displays—TFT Technologies and Related Materials-, AM-LCD 02, The Japan Society of Applied Physics, Jul. 10-12, 2002, pp. 77-80.

* cited by examiner

*Primary Examiner*—Mariceli Santiago
*Assistant Examiner*—Anthony Perry
(74) *Attorney, Agent, or Firm*—McDermott Will & Emery LLP

(57) ABSTRACT

An organic electro luminescence element includes a substrate, an anode isolating film formed of an insulator on the substrate, an anode conductive layer formed on an upper surface of the substrate in an area partitioned by the anode isolating film, and an element isolating film formed of an insulator to enclose the anode isolating film and to be wider downward. Further, on the upper surface of the anode isolating film, a conductive film of the same type as the anode conductive layer is formed, which conductive layer is also covered by the element isolating film. Preferably, the anode isolating film has its upper surface made larger than the lower surface.

8 Claims, 4 Drawing Sheets

ORGANIC ELECTRO LUMINESCENCE ELEMENT AND MANUFACTURING METHOD THEREOF

BACKGROUND OF THE INVENTION

1. Field of the Invention

The present invention relates to an organic electro luminescence element (also referred to as an "organic EL element").

2. Description of the Background Art

A general active matrix type organic EL element has a bottom emission structure in which light is taken out from the side of a TFT array substrate. This structure has a disadvantage that part of the light to be emitted is shielded by a pixel circuitry, that is, numerical aperture becomes smaller, which problem becomes more serious as the definition becomes higher. To address this problem, a top emission structure has been proposed, in which the light is taken out from the top surface that is opposite to the TFT array substrate, in order to improve the numerical aperture of the organic EL element.

By way of example, Japanese Patent Laying-Open No. 2001-43980 discloses an organic EL element having the top emission structure formed by placing an organic EL layer including a light emission layer, a hole transporting layer and the like, between an anode that reflects light and a cathode that transmits light. In this organic EL element, a metal belonging to group 5 or 6 of the periodic table, such as Cr, is used as a material of the anode. Here, it is indicated that work function of the anode is as low as less than 4.8 eV. When holes are to be injected to the hole transport layer having ionization potential of 5.0 eV or higher, the anode that has such a small work function causes a problem that injection efficiency decreases and that driving voltage increases.

As an improvement of the technique disclosed in Japanese Patent Laying-Open No. 2001-43980 mentioned above, Japanese Patent Laying-Open No. 2002-198182 discloses a structure in which Au, which is a material having high work function, is deposited to the thickness of 1 to 10 nm as a hole injecting thin film layer, on a light-reflecting anode portion. This is to increase the hole injection efficiency, and to have the anode portion bear the role of reflecting light, by increasing transmittance of the Au film. This structure, however, has a problem that a metal such as Au having high work function described as a thin film layer for hole injection is not suitable for fine processing such as lithography. A metal having high work function such as Au is chemically stable, and it is difficult to remove by etching. This is the main reason why such metal is not suitable for fine processing. In view of the foregoing, in Japanese Patent Laying-Open No. 2002-198182 mentioned above, a shadow mask is employed for selective vapor deposition at an opening only, when the thin film layer for hole injection is vapor-deposited, so that a pattern of a metal film having high work function is formed. Even in this manufacturing method, however, pattern-processing accuracy is low and insufficient for attaining higher definition. Further, this manufacturing method has a problem that highly accurate alignment of the shadow mask becomes necessary to manufacture the element having the above described structure, which leads to lower productivity. After all, there still remains the problem that fine processing of a metal film having high work function is difficult for forming the thin film layer for hole injection, and a solution has not been found.

As described above, in the conventional top emission structure, such an anode structure that enables higher efficiency of hole injection to the organic EL layer, having light reflection characteristic for taking out light from the organic EL layer to the front surface and allowing formation of a high definition pattern has not been found. Therefore, there has been an essential problem that even when the numerical aperture could be improved by the adoption of the top emission structure, general performance could not be enhanced.

SUMMARY OF THE INVENTION

Therefore an object of the present invention is to provide an organic electro luminescence element that enables higher hole injection efficiency to the organic EL layer, has a light reflection characteristic for taking out light emitted from the organic EL layer to the front surface and allows formation of a high definition pattern, and to provide a manufacturing method therefor.

In order to attain the above described object, the present invention provides an organic electro luminescence element, including: a substrate; an anode isolating film formed of an insulator on the substrate; an anode conductive layer formed on an upper surface of the substrate in an area partitioned by said anode isolating film; and an element isolating film formed of an insulator to enclose the anode isolating film and made wider downward.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
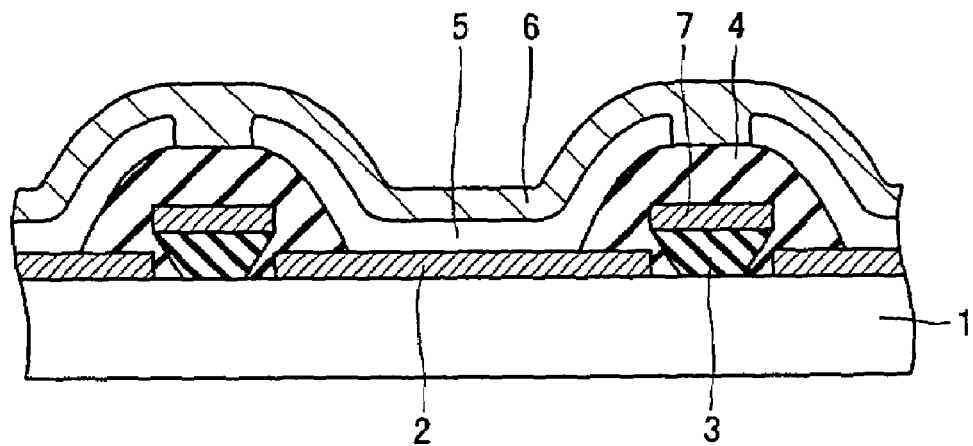
FIG. 1 is a cross section of an organic EL element in accordance with a first embodiment of the present invention.

Referring to FIG. 1, an organic EL element in accordance with the first embodiment of the present invention will be described. The organic EL element includes a substrate 1, an anode isolating film 3 formed of an insulator on substrate 1, an anode conductive layer 2, and an element isolating film 4. Anode isolating film 3 has its upper surface made larger than the lower surface, and a side surface of anode isolating film 3 is inclined. Namely, the film has a so-called "inverse tapered shape." Anode conductive layer 2 is formed on the upper surface of substrate 1 in each of the areas two-dimensionally divided pixel by pixel by anode isolating film 3. Element isolating film 4 is formed of an insulator to enclose anode isolating film 3, with lower side made wider. More noticeable characteristic of the organic EL element is that a conductive layer 7 of the same type as anode electrode layer 2 is also formed on anode isolating film 3. Conductive layer 7 is covered by element isolating film 4.

In the example shown in FIG. 1, anode conductive layer 2 is a metal layer mainly having the nature of reflecting light. Anode conductive layer 2 serves as a so-called pixel electrode, and an opening portion of element isolating film 4 is covered by anode conductive layer 2. At the opening portion of element isolating film 4, an organic EL layer 5 is arranged on anode conductive layer 2. Organic EL layer 5 is arranged such that it covers the upper side of anode electrode layer 2 that is exposed at the opening portion of element isolating film 4, and partially extends on element isolating film 4. A cathode conductive layer 6 is arranged to cover the upper surface of organic EL layer 5 and further cover the upper side of element isolating film 4. Cathode conductive layer 6 is formed of a material that passes light (hereinafter referred to as "light transmitting" material), and is formed continuously over a plurality of pixel areas.

Though not shown in FIG. 1, conventional absorbent, sealing member, sealing agent, polarizing plate, various optical films and the like are arranged in a conventional manner, in addition to the elements mentioned above.

Further, anode conductive layer 2 should preferably include a layer having work function of at least 4.8 eV (hereinafter referred to as a "layer of high work function"). In the example of FIG. 1, anode conductive layer 2 has a structure consisting of a single metal layer, and the metal layer corresponds to the layer of high work function. Anode conductive layer 2 may have a stacked structure including a plurality of layers, at least one of which is the layer of high work function.

Material of the layer of high work function may include metal having high work function such as Au, Pt, Ir, Pd, Se, Ni, Co, Os or an alloy containing such metal. The value of the work function is preferably 4.8 eV or higher as described above, and the value of 5.0 eV or higher is more preferable.

Anode isolating film 3 is formed, by way of example, of a resin composition such as acryl, polyimide, or novolac. Alternatively, it may be formed of an inorganic insulating film.

A compound forming organic EL element 5 is not specifically limited, and a low molecular compound, a high molecular compound, or a high molecular matrix with low molecules dispersed therein may be used. As the method of forming the organic EL layer, a dry process such as vacuum deposition or shadow mask patterning of vacuum deposition may be employed. Other than these, wet process or various printing methods may be used, including spin coating, dip coating, ink-jet printing, screen printing and photogravure.

As cathode conductive layer 6, any light transmitting conductive film may be used, and by way of example, ITO (Indium Tin Oxide) or IZO (Indium Zinc Oxide) film is used. On such a light transmitting conductive film, a metal electrode and an insulating film for improving electron injection characteristic may be deposited thinly. The light transmittance is preferably at least 50% and more preferably, at least 70%. As a method of forming cathode conductive layer 6, sputtering, CVD or vacuum deposition may be applied.

In the present embodiment, anode isolating film 3 having its upper surface made larger than its lower surface isolates pixel areas from each other. Therefore, in the vapor deposition for forming anode conductive layer 2 in each pixel area, anode isolating films 3 to be pixel electrodes in adjacent pixels are electrically disconnected from each other without fail. Thus, it becomes possible to easily form high definition patterns without performing selective vapor deposition or pattern formation through etching. Accordingly, metal having high work function of which fine processing is difficult can be selected as the material of the anode conductive layer without any problem. As a method of manufacturing the anode conductive layer, a common method of thin film formation such as sputtering may be adopted.

In the organic EL element in accordance with the present embodiment, anode conductive layer 2 as the pixel electrode can be formed of a metal having high work function in this manner, and therefore, efficiency of hole injection to organic EL layer 5 can be enhanced. While anode conductive layer 2 is arranged separately in each pixel area, cathode conductive layer 6 is formed and used as a common electrode.

In the following, how the above described desired shapes are attained during formation of anode isolating film 3 and element isolating film 4 will be described. Specifically, such shapes can be attained by adjusting conditions of exposure, development, etching, baking and the like for respective materials. By way of example, when a negative type photo-sensitive novolac resin is used as anode isolating film 3 to have higher photo-sensitivity, light would be absorbed at an upper portion of the film during exposure, and optical reaction would be less likely at a lower portion of the film. When development is performed in this state, the upper portion of the film is less soluble in the developer and the lower portion becomes more soluble in the developer. Thus, the so-called "inverse tapered" pattern can be attained, with the upper surface being larger than the lower surface. When a positive photo-sensitive polyimide resin is used as element isolating film 4, a pattern is formed by typical development and thereafter post baking at about 200° C. is performed, whereby a so-called "regular tapered" shape can be formed, with the lower surface being larger than the upper surface, that is, with the lower side expanding widely. For more reliable coverage, it is preferred that element isolating film 4 is made thicker than anode isolating film 3.

In the present embodiment, an example of an organic EL element for color display has been described, in which part of organic EL layer 5 is divided pixel by pixel to be separate layers. It is noted, however, that the present invention is also applicable to an organic EL element for monochrome display, an in that case, the organic EL layer may have a structure that is continuous over a plurality of pixels.

Second Embodiment

Referring to FIGS. 2 to 5 as well as FIG. 1, a method of manufacturing an organic EL element in accordance with the second embodiment of the present invention will be described.

Figure 2:
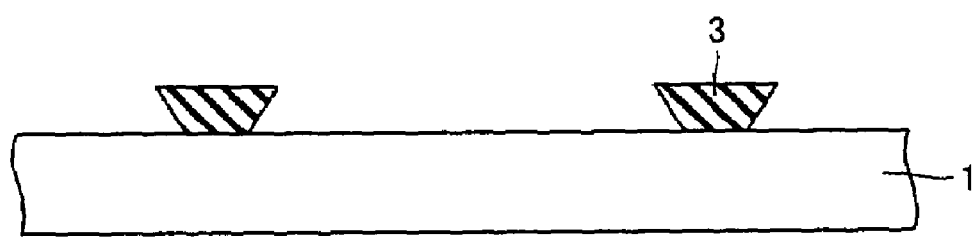
FIG. 2 is an illustration showing a first step of manufacturing an organic EL element in accordance with a second embodiment of the present invention.
Figure 3:
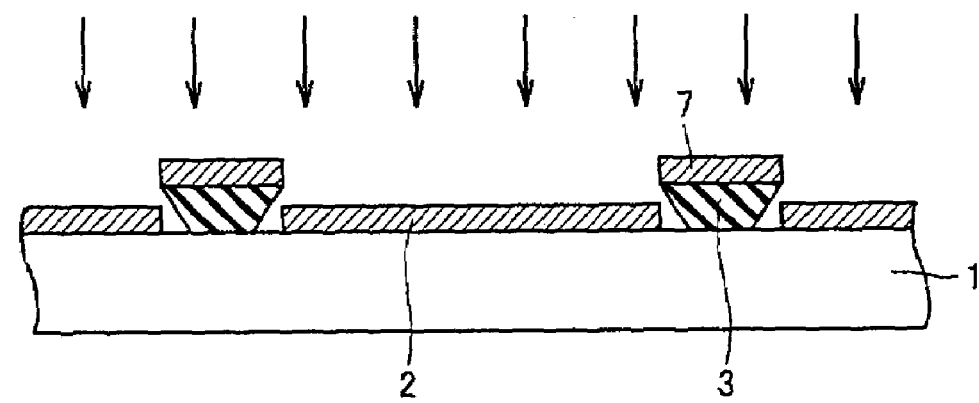
FIG. 3 is an illustration showing a second step of manufacturing an organic EL element in accordance with the second embodiment of the present invention.
Figure 4:
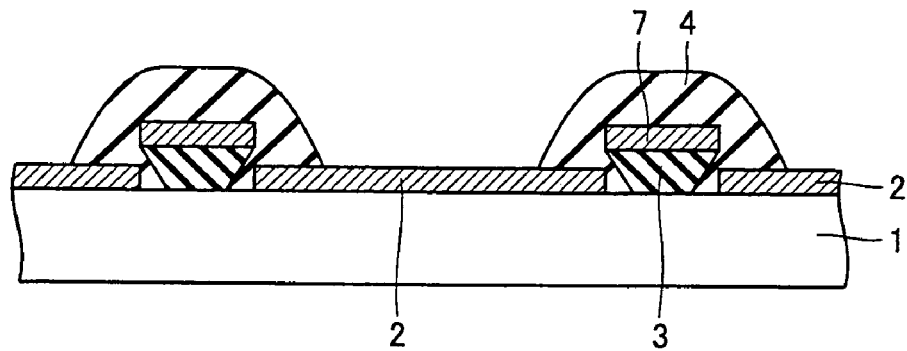
FIG. 4 is an illustration showing a third step of manufacturing an organic EL element in accordance with the second embodiment of the present invention.
Figure 5:
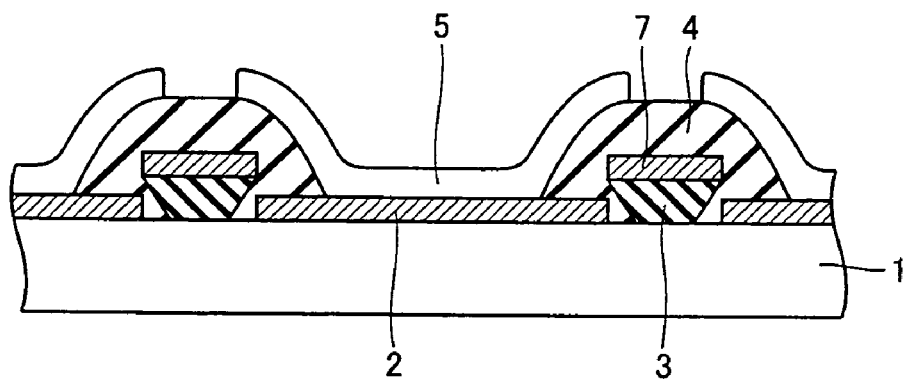
FIG. 5 is an illustration showing a fourth step of manufacturing an organic EL element in accordance with the second embodiment of the present invention.

As shown in FIG. 2, on an upper surface of substrate 1, a pattern of anode isolating film 3 is formed of an insulator. It is noted that anode isolating film 3 is formed to have an upper surface made larger than the lower surface through the method described as an example in the first embodiment. Next, as shown in FIG. 3, a metal film is formed. At this time, when metal is vapor-deposited directly from above as represented by the arrows of FIG. 3, metal films are formed on the upper surface of substrate 1 and on the upper surface of anode isolating film 3 physically and electrically separated from each other, to be anode conductive layer 2 and conductive layer 7, respectively, because of the shape of anode isolating film 3. Then, as shown in FIG. 4, element isolating film 4 is formed of an insulator. Element isolating film 4 is formed to be wider downward through the method described as an example in the first embodiment. Organic EL layer 5 is formed as shown in FIG. 5. Organic EL layer 5 is formed to cover the upper side of anode conductive layer 2 and element isolating film 4. It is noted, however, that part of organic EL layer 5 is formed as a separate pattern corresponding to each of exposed portions of anode conductive layer 2, that is, each of the pixel areas. Though separate formation area by area of pixels is typical in an organic EL element for color display, the organic EL layer may not be divided for each pixel area but may be formed continuously. Further, cathode conductive layer 6 is formed to cover the upper sides of organic EL layer 5 and element isolating film 4, whereby the organic EL element shown in FIG. 1 is obtained. The method of forming cathode conductive layer is as described with reference to the first embodiment.

By the present embodiment, the organic EL element described with reference to the first embodiment can readily be manufactured.

Third Embodiment

Figure 6:
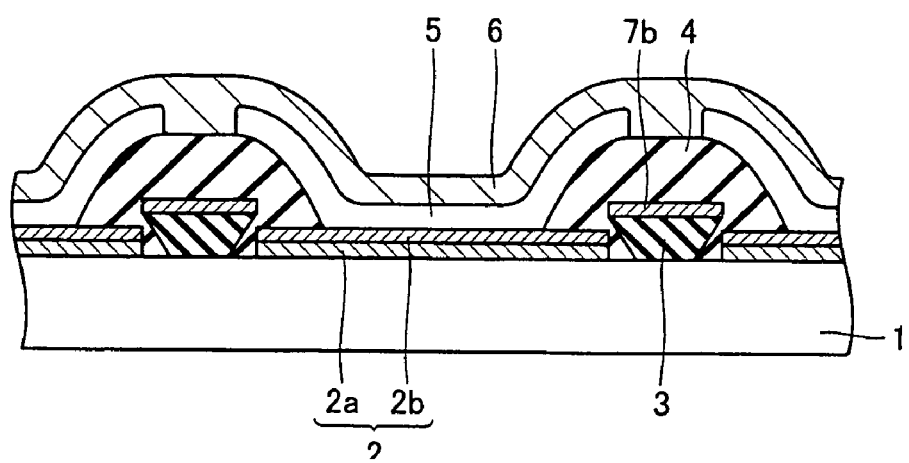
FIG. 6 is a cross section of an organic EL element in accordance with third, fourth and fifth embodiments of the present invention.

Referring to FIG. 6, an organic EL element in accordance with the third embodiment of the present invention will be described. In the organic EL element, anode conductive layer 2 has a multi-layered structure. Anode conductive layer 2 may have a stacked structure of three or more layers, and as an example of the stacked structure, a two-layered structure including layers 2a and 2b is shown in FIG. 6. In anode conductive layer 2 having the multi-layered structure, as a layer closest to organic EL layer 5, that is, the uppermost layer 2b, such type of metal as described in the first embodiment is used. Specifically, a material having high work function is preferred as the material of layer 2b. Preferable examples include Au, Pt, Ir, Pd, Se, Ni, Co, Os or an alloy containing such metal. Among the layers constituting anode conductive layer 2, as the layer 2a far from organic EL element 5, any conductive thin film may be used, regardless of the work function. By way of example, Al, Ti, Cr, Fe, Ni, Co, Cu, Mo, W or an alloy of such a metal may be used. The layer 2a that will be in contact with substrate 1 should preferably be formed of a material that has good adhesion with substrate 1.

The uppermost layer of anode conductive layer 2 is formed by the method of forming anode conductive layer described in the first embodiment in which vapor deposition is performed directly from above on the entire surface, so as to form patterns of pixel electrodes separately, utilizing the shape of anode isolating film 3. The layers of anode conductive layer other than the uppermost layer may be patterned beforehand by common lithography.

Except for this point, the structure is the same as that described with reference to the first embodiment. Particularly, anode conductive film 3 has the upper surface made larger than the lower surface. The angle formed by the upper surface and the lower surface at an upper end portion of anode isolating film 3 is at most 90°, and anode isolating film 3 viewed in a cross section has a vertical or a so-called inverse tapered shape. Further, element isolating film 4 has a downwardly widening shape. The angle formed by an upper surface and a side surface of an upper end portion of element isolating film 4 is at least 90°, and when viewed in a cross section, it has a so-called vertical shape or a regular tapered shape.

In the organic EL element in accordance with the present embodiment, as in the first embodiment, anode conductive layer 2 can be formed in an arrangement geometrically and electrically separated at the upper surface of substrate 1 and at the upper surface of anode isolating film 3. Therefore, it becomes possible to readily form a high definition pattern of pixel electrodes using a material having high work function, which has been difficult by other methods. As the pixel electrodes are formed of a material having high work function, efficiency of hole injection to the organic EL layer can be improved, and efficiency of the organic EL element can also be improved.

Further, in the organic EL element in accordance with the present embodiment, anode conductive layer 2 has a multi-layered structure as shown in FIG. 6, and therefore, it is possible to use different types of materials for the layer that is in contact with the lower structure such as substrate 1 and for the layer that is in contact with organic EL layer 5. This increases degree of freedom in selecting the material. As optimal materials can be selected for the uppermost layer and the lowermost layer, it becomes possible to improve adhesion of anode conductive layer 2 with the lower structure such as substrate 1, while hole injection efficiency is improved.

Fourth Embodiment

Referring to FIG. 6, an organic EL element in accordance with the fourth embodiment of the present invention will be described. In the organic EL element, anode conductive layer 2 has a multi-layered structure. As in the third embodiment, a material having high work function is used for the uppermost layer 2b.

In the present embodiment, the layer 2b as the uppermost layer and the layer of high work function has its thickness set in a range of 0.5 nm to 10 nm, so as to ensure light transmittance. Further, a material having high reflectance is used for the layer 2a that is immediately below the uppermost layer. By way of example, Al, Ag or an alloy of such metal is used. As the material having high reflectance, one having reflectance of at least 80% in a visible range is preferred. This should preferably be used as the second or lower layer from the top. Layers of anode conductive layer other than the uppermost layer may be patterned beforehand by common lithography.

Except for this point, the embodiment is the same as the first embodiment.

In the organic EL element in accordance with the present embodiment, as in the first embodiment, it becomes possible to form the high definition pattern of pixel electrodes using a material having high work function, and as a result, efficiency of hole injection to the organic EL layer is improved and the efficiency of the organic EL element is improved.

Further, by selecting optimal materials for the uppermost layer and the layer immediately therebelow, it becomes possible to improve hole injection efficiency and to improve reflectance exhibited by anode conductive layer 2 as a whole. Therefore, light taking efficiency of the organic EL light emission phenomenon and the efficiency of the organic EL element can be improved.

Fifth Embodiment

Referring to FIG. 6, an organic EL element in accordance with the fifth embodiment of the present invention will be described. In the organic EL element, anode conductive layer 2 has a multi-layered structure. As in the third and fourth embodiments, a material having high work function is used for the uppermost layer 2b.

In the present embodiment, the layer 2b as the uppermost layer and the layer of high work function has its thickness set in a range of 0.5 nm to 10 nm, so as to ensure light transmittance. Further, a material of which reflectance does not much fluctuate dependent on wavelength is used for the layer 2a that is immediately below the uppermost layer. By way of example, Cr, Mo, Ta or an alloy of such metal is used. Layers of anode conductive layer other than the uppermost layer may be patterned beforehand by common lithography.

Except for this point, the structure is the same as that described with reference to the first embodiment.

In the organic EL element in accordance with the present embodiment, as in the first embodiment, it becomes possible to form the high definition pattern of pixel electrodes using a material having high work function, and as a result, efficiency of hole injection to the organic EL layer is improved and the efficiency of the organic EL element is improved.

Further, by selecting optimal materials for the uppermost layer and the layer immediately therebelow, it becomes possible to reflect the light emitted by the organic EL layer with the emission spectrum almost intact, by anode conductive layer as a whole. Therefore, an organic EL element capable of displaying correct colors can be obtained.

Sixth Embodiment

Figure 7:
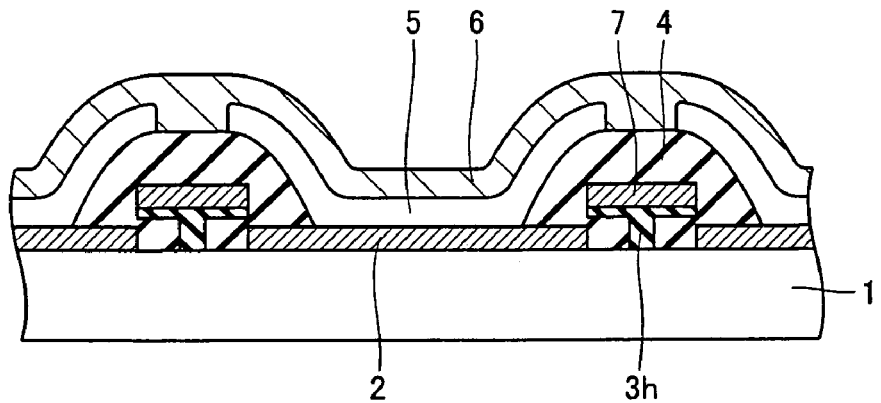
FIG. 7 is a cross section of an organic EL element in accordance with a sixth embodiment of the present invention.

Referring to FIG. 7, the organic EL element in accordance with the sixth embodiment of the present invention will be described. The organic EL element is the same as that of the first embodiment except that the anode isolating film has a different shape. The organic EL element of the present embodiment includes an anode isolating film 3h as shown in FIG. 7. Anode isolating film 3h is the same as that of the first embodiment in that it has the upper surface made larger than the lower surface. Different from anode isolating film 3 having the inverse tapered shape of the first embodiment, anode isolating film 3h of the present embodiment has a T shape when viewed in a cross section.

Such an anode isolating film 3h can be formed by stacking and etching two different types of layers having different etch rates. By way of example, a two-layered structure, in which a silicon nitride film is stacked on a silicon oxide film, is dry-etched using a common resist in a gas atmosphere including a fluorine based gas such as $CF_4$ and $CHF_3$, so that both the silicon oxide film and the silicon nitride film are patterned. Thereafter, the lower, silicon oxide film is etched by an HF aqueous solution, whereby anode isolating film 3h can be obtained. The reason for this is as follows. The silicon oxide film having high etch rate with HF aqueous solution is much removed from side portions, while silicon nitride film having low etch rate is not much removed from the side portions. As a result, the T-shaped cross sectional shape results.

As another method of forming anode isolating film 3h, a two-layered structure, in which a silicon nitride film is stacked on a silicon oxide film, is dry-etched using a common resist in a gas atmosphere including a fluorine based gas such as $CF_4$ and $CHF_3$, so that both the silicon oxide film and the silicon nitride film are patterned. Thereafter, the lower, silicon oxide film is etched by hot phosphoric acid, whereby anode isolating film 3h can be obtained. The reason for this is as follows. The silicon oxide film having high etch rate with hot phosphoric acid is much removed from side portions, while silicon nitride film having low etch rate is not much removed from the side portions. As a result, the T-shaped cross sectional shape results.

By the structure of the organic EL element of the present embodiment also, similar effects as the first embodiment can be attained. The structure of the present embodiment may be combined with the structure of the third, fourth or fifth embodiment.

Seventh Embodiment

Figure 8:
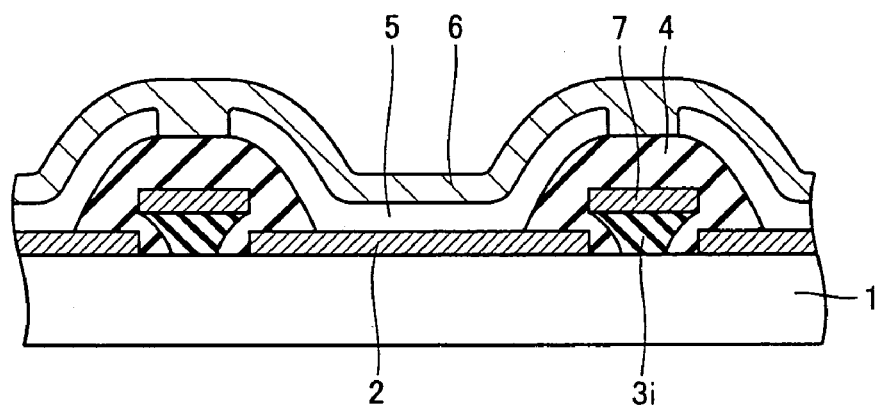
FIG. 8 is a cross section of an organic EL element in accordance with a seventh embodiment of the present invention.

Referring to FIG. 8, an organic EL element in accordance with the seventh embodiment of the present invention will be described. The organic EL element is the same as that of the first embodiment except that the anode isolating film has a different shape. The organic EL element of the present embodiment includes an anode isolating film 3i as shown in FIG. 8. Anode isolating film 3i is the same as that of the first embodiment in that it has the upper surface made larger than the lower surface. Different from anode isolating film 3 having the inverse tapered shape of the first embodiment, anode isolating film 3i of the present embodiment has a concave, curved side surface.

The anode isolating film having such a shape may be realized by performing one of the following steps <1> to <4>, followed by exposure and development.
<1> Exposing an upper surface of a chemically amplified type positive resist film to an alkali atmosphere.
<2> Immersing an upper surface of a chemically amplified type positive resist film in an alkali solution.
<3> Exposing an upper surface of a chemically amplified type negative resist film to an acid atmosphere.
<4> Immersing an upper surface of a chemically amplified type negative resist film in an acid solution.

By the structure of the organic EL element of the present embodiment also, similar effects as the first embodiment can be attained. The structure of the present embodiment may be combined with the structure of the third, fourth or fifth embodiment.

Eighth Embodiment

Figure 9:
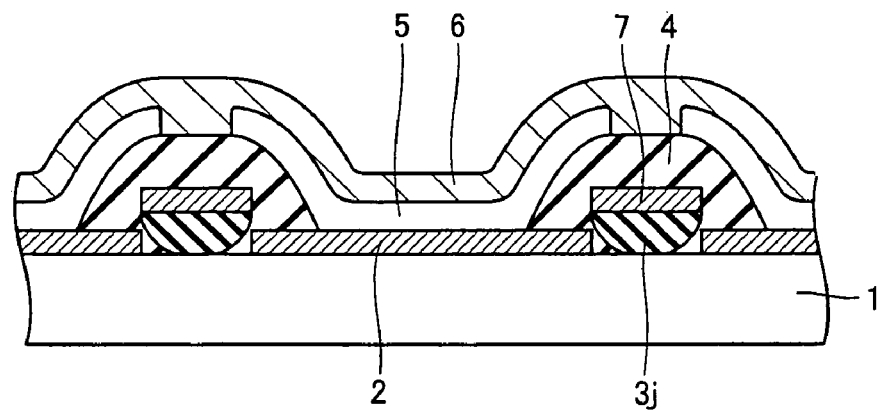
FIG. 9 is a cross section of an organic EL element in accordance with an eighth embodiment of the present invention.

Referring to FIG. 9, an organic EL element in accordance with the eighth embodiment of the present invention will be described. The organic EL element is the same as that of the first embodiment except that the anode isolating film has a different shape. The organic EL element of the present embodiment includes an anode isolating film 3j as shown in FIG. 9. Anode isolating film 3*j* is the same as that of the first embodiment in that it has the upper surface made larger than the lower surface. Different from anode isolating film 3 having the inverse tapered shape of the first embodiment, anode isolating film 3*j* of the present embodiment has a convex, curved side surface.

The anode isolating film having such a shape may be realized by performing one of the following steps <5> to <8>, followed by exposure and development.

<5> Exposing substrate 1 to an acid atmosphere in advance and thereafter arranging a chemically amplified type positive resist.

<6> Immersing substrate 1 in an acid solution in advance and thereafter arranging a chemically amplified type positive resist.

<7> Exposing substrate 1 to an alkali atmosphere in advance and thereafter arranging a chemically amplified type negative resist.

<8> Immersing substrate 1 in an alkali solution in advance and thereafter arranging a chemically amplified type negative resist.

Here, in steps <5> to <8>, processing using acid or alkali is performed on substrate 1, as substrate 1 is the layer immediately below the anode isolating film. When the layer immediately below the anode isolating layer is a layer different form substrate 1, the processing may be performed on the corresponding layer.

By the structure of the organic EL element of the present embodiment also, similar effects as the first embodiment can be attained. The structure of the present embodiment may be combined with the structure of the third, fourth or fifth embodiment.

Ninth Embodiment

Figure 10:
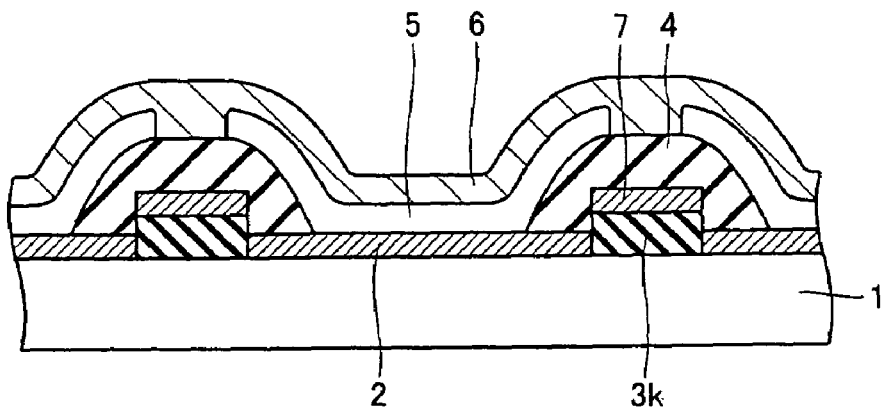
FIG. 10 is a cross section of an organic EL element in accordance with a ninth embodiment of the present invention.

Referring to FIG. 10, an organic EL element in accordance with the ninth embodiment of the present invention will be described. The organic EL element is the same as that of the first embodiment except that the anode isolating film has a different shape. The organic EL element of the present embodiment includes an anode isolating film 3*k* as shown in FIG. 10. Anode isolating layer 3*k* has the upper surface and the lower surface of the same size, that is, a so-called "vertical structure". The anode isolating film having such a structure can be realized by performing common exposure and development in accordance with the known technique.

Even in the structure of the organic EL element of the present embodiment, when a metal film for the anode conductive layer is vapor-deposited, the metal layer is disconnected because of difference in height resulting from anode isolating film 3*k*. Therefore, pixel electrodes corresponding to adjacent pixels can be electrically disconnected. Therefore, after all, similar effects as the first embodiment can be attained. The structure of the present embodiment may be combined with the structure of the third, fourth or fifth embodiment.

In order to more reliably prevent electrical connection between pixel electrodes of adjacent pixels, however, it is preferred that the anode isolating film is formed to have the upper surface made larger than the lower surface, as shown in the first, sixth, seventh and eighth embodiments.

Tenth Embodiment

Figure 11:
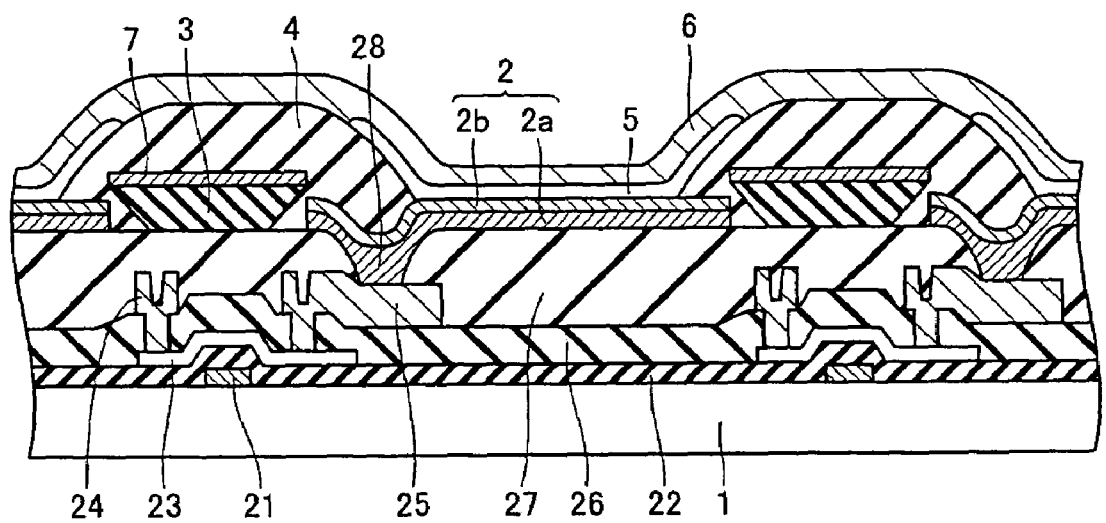
FIG. 11 is a cross section of an organic EL element in accordance with a tenth embodiment of the present invention.

Referring to FIG. 11, an organic EL element in accordance with the tenth embodiment will be described. The organic EL element is the same as the third embodiment (see FIG. 6) with respect to the shapes of the anode isolating film and element isolating film and to the manner of combining two conductive layers. In the third embodiment, the layer immediately below and in contact with anode conductive layer 2 or anode isolating film 3 was substrate 1. In the present embodiment, the layer immediately below and in contact is interlayer insulating film 27, on which a TFT array and an interconnection are arranged. Specifically, on the upper surface of substrate 1, gate electrodes 21 are arranged corresponding to respective pixels, and a gate insulating film 22 is formed to cover the upper surface of substrate 1 including the gate electrodes 21. On the gate insulating film 22, a semiconductor thin film 23 is formed at a position corresponding to each gate electrode 21, constituting a TFT element. An interlayer insulating film 26 is formed to cover the upper surface of gate insulating film 22 including semiconductor thin film 23. A source electrode 24 and a drain electrode 25 are formed penetrating through interlayer insulating film 26 in vertical direction, to be connected to the source side and the drain side of semiconductor thin film 23. An interlayer insulating film 27 is formed to cover the upper surface of interlayer insulating film 26, including source electrode 24 and drain electrode 25. A pixel contact hole 28 is formed to penetrate interlayer insulating film 27 in the vertical direction, and anode conductive layer 2 as the pixel electrode and drain electrode 25 are electrically connected. Though not shown in FIG. 11, an interconnection is separately provided for source electrode 24, and by the collection of these TFT elements, a TFT array is formed. Anode conductive layer 2 may be connected to source electrode 24 in place of drain electrode 25.

The TFT array and the like described here have common structure and can be manufactured through conventional manufacturing steps. The material of interlayer insulating films 26, 27 is not specifically limited, and a resin composition such as acryl, polyimide or novolac, or an inorganic insulator may be used.

By such a structure, in an organic EL display of an active matrix type in which the organic EL element is driven by a TFT element, efficiency of hole injection to the organic EL layer can be improved, and hence, efficiency of the organic EL element can be improved.

By adopting the same structure as the present embodiment in the first to ninth embodiments, the present invention can be adapted for an active matrix type display.

According to the present invention, as the anode isolating film separates pixel areas from each other, the anode isolating films to be pixel electrodes of adjacent pixels can be electrically disconnected, without the necessity of performing selective vapor deposition using a shadow mask or pattern formation by etching. Therefore, patterns of high definition can readily be formed. As a result, it becomes possible to select a metal having high work function, of which highly definite processing has been difficult, as the material of the anode conductive film without any problem. By forming the anode conductive layer using a metal having high work function, it becomes possible to improve efficiency of hole injection to the organic EL layer. Further, it also becomes possible to realize light reflecting characteristic to draw the light emission to the front surface.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An organic electro luminescence element, comprising:
a substrate;
an anode isolating film formed of an insulator on said substrate;
an anode conductive layer formed on an upper surface of said substrate in an area partitioned by said anode isolating film; and
an element isolating film formed of an insulator to enclose said anode isolating film, and made wider downward; and wherein
said anode isolating film has an upper surface made larger than a lower surface.

2. The organic electro luminescence element according to claim 1, wherein
a film of the same type as said anode conductive layer is formed on an upper surface of said anode isolating film, and the film is covered by said element isolating film.

3. The organic electro luminescence element according to claim 1, wherein the anode isolating film comprises a side surface that is inclined in an inverse tapered shaped configuration.

4. The organic electro luminescence element according to claim 1, wherein
said anode conductive layer includes a layer of high work function, having work function of at least 4.8 eV.

5. The organic electro luminescence element according to claim 4, wherein
said anode conductive layer has a stacked structure including at least two layers, and said layer of high work function is positioned as an uppermost layer of said stacked structure.

6. The organic electro luminescence element according to claim 5, wherein
said anode conductive layer includes a layer having reflectance of at least 80% in a visible range, as a second or lower layer from the top of said stacked structure.

7. The organic electro luminescence element according to claim 4, wherein
said layer of high work function has a thickness of at least 0.5 nm and at most 10 nm.

8. A method of manufacturing an organic electro luminescence element, comprising the steps of:
forming, on an upper surface of a substrate, an anode isolating film of an insulator such that an upper surface of the isolating film is made larger than a lower surface;
forming an anode conductive layer of a metal from an upper side of said substrate to an area including said anode isolating film; and
forming an element isolating film of an insulator to enclose said anode isolating film and to be made wider downward.

* * * * *